US008885144B2

(12) United States Patent
Claessens et al.

(10) Patent No.: US 8,885,144 B2
(45) Date of Patent: Nov. 11, 2014

(54) ILLUMINATION SYSTEM AND LITHOGRAPHIC APPARATUS

(75) Inventors: Bert Jan Claessens, Spalbeek (BE); Heine Melle Mulder, Veldhoven (NL); Paul Van Der Veen, Waalre (NL); Wilfred Edward Endendijk, Steensel (NL); Willem Jan Bouman, Moergestel (NL); Bert Pieter Van Drieënhuizen, Veldhoven (NL); Jozef Ferdinand Dymphna Verbeeck, Belgium (BE); Marc Hendricus Margaretha Dassen, Eindhoven (NL); Thijs Johan Henry Hollink, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 642 days.

(21) Appl. No.: 13/114,652

(22) Filed: May 24, 2011

(65) Prior Publication Data

US 2011/0310372 A1 Dec. 22, 2011

Related U.S. Application Data

(60) Provisional application No. 61/348,417, filed on May 26, 2010.

(51) Int. Cl.
*G02B 5/08* (2006.01)
*G03B 27/32* (2006.01)
*G03B 27/54* (2006.01)
*G03F 7/20* (2006.01)

(52) U.S. Cl.
CPC ........ *G03F 7/70116* (2013.01); *G03F 7/70291* (2013.01); *G03F 7/70508* (2013.01); *G03F 7/70516* (2013.01)
USPC .............................. 355/67; 355/77; 359/865

(58) Field of Classification Search
CPC ... G03F 7/70; G03F 7/70116; G03F 7/70133; G03F 7/70141; G03F 7/70291; G03F 7/70508; G03F 7/70506
USPC ................... 355/53, 67, 68, 77; 359/850, 856
See application file for complete search history.

(56) References Cited

U.S. PATENT DOCUMENTS

| | | | |
|---|---|---|---|
| 7,061,586 B2 | 6/2006 | Sytsma et al. | |
| 7,696,493 B2 | 4/2010 | Van Herpen et al. | |

(Continued)

FOREIGN PATENT DOCUMENTS

| | | |
|---|---|---|
| CN | 101681115 | 3/2010 |
| JP | 2001-284217 | 10/2001 |

(Continued)

OTHER PUBLICATIONS

Taiwan Office Action dated Aug. 23, 2013 in corresponding Taiwan Patent Application No. 100115648.
Chinese Office Action dated Apr. 1, 2013 in corresponding Chinese Patent Application No. 201110122353.5.
Japanese Office Action mailed Aug. 7, 2012 in corresponding Japanese Patent Application No. 2011-111950.

*Primary Examiner* — Colin Kreutzer
(74) *Attorney, Agent, or Firm* — Pillsbury Winthrop Shaw Pittman LLP

(57) ABSTRACT

An illumination system having an array of individually controllable optical elements is disclosed, wherein each element is moveable between a plurality of orientations which may be selected in order to form desired illumination modes. The illumination system includes a controller to control orientation of one or more of the elements, the controller configured to apply force to the one or more elements which at least partially compensates for force applied to the one or more elements by a burst of radiation incident upon the one or more elements.

20 Claims, 2 Drawing Sheets

(56) References Cited

U.S. PATENT DOCUMENTS

| | | |
|---|---|---|
| 7,889,321 B2 | 2/2011 | Van Schoot et al. |
| 8,089,672 B2 | 1/2012 | Tinnemans et al. |
| 2005/0195380 A1 | 9/2005 | Sytsma et al. |
| 2006/0187517 A1* | 8/2006 | Ljungblad .................... 359/237 |
| 2007/0165202 A1 | 7/2007 | Koehler et al. |
| 2008/0079930 A1* | 4/2008 | Klarenbeek .................. 356/121 |
| 2008/0142741 A1 | 6/2008 | Van Herpen et al. |
| 2008/0246940 A1 | 10/2008 | Van Schoot et al. |
| 2009/0046264 A1* | 2/2009 | Pouls ............................ 355/53 |
| 2009/0190197 A1 | 7/2009 | Tinnemans et al. |
| 2010/0020300 A1 | 1/2010 | Bouman et al. |

FOREIGN PATENT DOCUMENTS

| | | |
|---|---|---|
| JP | 2008-015256 | 1/2008 |
| JP | 2008-052270 | 3/2008 |
| JP | 7009-152607 | 7/2009 |
| JP | 2009-244760 | 10/2009 |
| JP | 2010-034553 | 2/2010 |
| JP | 2010-093262 | 4/2010 |

\* cited by examiner

ILLUMINATION SYSTEM AND LITHOGRAPHIC APPARATUS

This application claims priority and benefit under 35 U.S.C. §119(e) to U.S. Provisional Patent Application No. 61/348,417, entitled "Illumination System and Lithographic Apparatus", filed on May 26, 2010. The content of that application is incorporated herein in its entirety by reference.

FIELD

The present invention relates to an illumination system and to a lithographic apparatus.

BACKGROUND

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes an illumination system. The illumination system receives radiation from a source, for example a laser, and produces a radiation beam suitable for illuminating a patterning device. Within a typical illumination system, the radiation beam is shaped and controlled such that at a pupil plane the radiation beam has a desired spatial intensity distribution, also referred to as an illumination mode. Examples of types of illumination modes are conventional, dipole, asymmetric, quadrupole, hexapole and annular illumination modes. The spatial intensity distribution at the pupil plane effectively acts as a secondary radiation source to produce the radiation beam. Following the pupil plane, the radiation is typically focused by an optical element (e.g., lens) group referred to hereafter as "coupling optics". The coupling optics couples the focused radiation into an integrator, such as a quartz rod. The function of the integrator is to improve the homogeneity of the spatial and/or angular intensity distribution of the radiation beam. The spatial intensity distribution at the pupil plane is converted to an angular intensity distribution at the integrator, because the pupil plane substantially coincides with the front focal plane of the coupling optics.

Controlling the spatial intensity distribution at the pupil plane can be done to improve processing latitudes when an image of a patterning device is projected onto a substrate. In particular, spatial intensity distributions with dipolar, annular or quadrupole off-axis illumination modes have been proposed to enhance the resolution and/or other parameters of the projection, such as sensitivity to projection system aberrations, exposure latitude and depth of focus.

SUMMARY

It is desirable to provide an illumination system and a lithographic apparatus which is capable of controlling the spatial intensity distribution of the beam with improved stability compared with, for example, a prior art lithographic apparatus.

According to an aspect, there is provided an illumination system comprising: an array of individually controllable optical elements, each element moveable between a plurality of orientations which may be selected in order to form desired illumination modes; and a controller to control orientation of one or more of the elements, the controller configured to apply force to the one or more of the elements which at least partially compensates for force applied to the one or more elements by a burst of radiation incident upon the one or more elements.

According to an aspect, there is provided an illumination system comprising: an array of individually controllable optical elements, each element moveable between a plurality of orientations which may be selected in order to form desired illumination modes; and a controller to control the orientations of one or more of the elements, the controller configured to move the one or more elements to an offset orientation before a burst of radiation is incident upon the one or more elements, the offset orientation selected such that force applied by the burst of radiation moves the one or more elements to a desired orientation.

According to an aspect, there is provided a method of selecting a desired illumination mode in an illumination system, the method comprising moving elements of an array of individually controllable optical elements to orientations which correspond with a desired illumination mode, and applying a force to one or more of the elements which at least partially compensates for a force which is applied to the one or more elements by a burst of radiation.

According to an aspect, there is provided an illumination system comprising an array of individually controllable optical elements, each element moveable between a plurality of orientations which may be selected in order to form a desired illumination mode, wherein one or more of the elements are surrounded by an ionized gas.

According to an aspect, there is provided a method of selecting a desired illumination mode in an illumination system, the method comprising moving elements of an array of individually controllable optical elements to orientations which correspond with the desired illumination mode, the elements surrounded by ionized gas.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
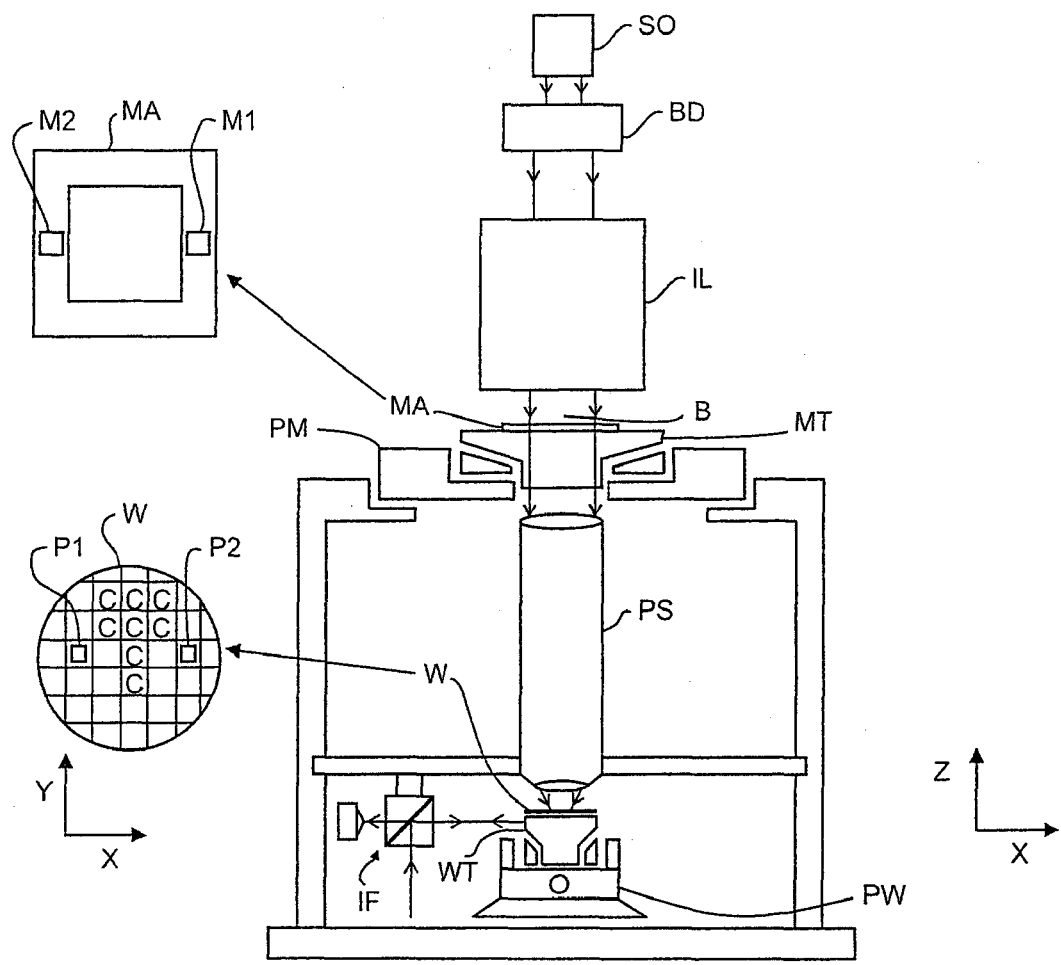
FIG. 1 shows a lithographic apparatus according to an embodiment of the invention.

FIG. 1 schematically shows a lithographic apparatus according to one embodiment of the invention. The apparatus comprises:

an illumination system (also known as an illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illumination system IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an apparatus which is configured to modify the angular intensity distribution of the radiation beam (described further below). In addition, the illumination system IL may comprise various other components, such as an integrator and a condenser. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
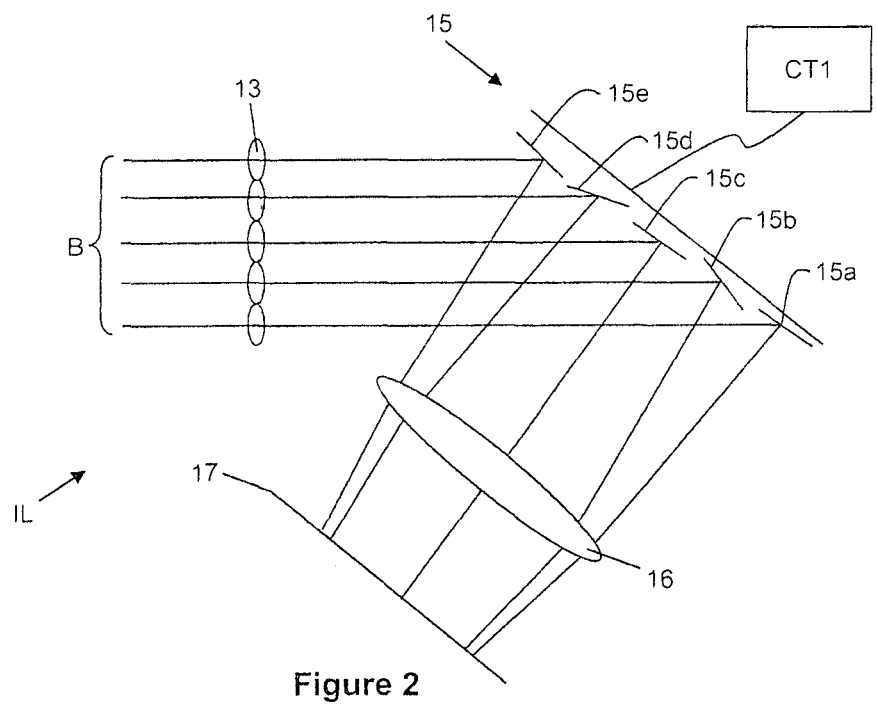
FIG. 2 shows an illumination system according to an embodiment of the invention.

FIG. 2 is a schematic illustration of an apparatus which forms part of the illumination system IL. The apparatus comprises a microlens array 13, an array of individually controllable reflective elements 15 (referred to hereafter as mirrors) and optics 16. In operation, the radiation beam B passes through the microlens array 13, which separates the radiation beam into a multiplicity of individually collimated radiation sub-beams, each of which is incident upon a different reflective mirror 15a-e of the array of individually controllable mirrors 15.

FIG. 2 shows a first radiation sub-beam incident at a first mirror 15a. Like the other mirrors 15b-e of the array of individually controllable mirrors 15, the mirror 15a reflects the sub-beam to an intermediate plane 17 via optics 16 (the optics may, for example, comprise a focusing lens). The intermediate plane 17 may be, for example, a pupil plane of the illumination system, which acts as a secondary radiation source of the lithographic apparatus. The other mirrors 15b-e reflect the other sub-beams to other areas of the plane 17 via the re-directing optics 16. By adjusting the orientations of the mirrors 15a-e and thus determining the locations in the plane 17 at which the sub-beams are incident, almost any spatial intensity distribution in the plane 17 can be produced. Thus, almost any illumination mode may be formed, thereby providing an improvement of process latitudes of the lithographic apparatus. A controller CT1 may be used to control the orientations of the mirrors 15a-e.

Although the array of individually controllable mirrors 15 is shown in FIG. 2 as five mirrors 15a-e, in practice a significantly larger number of mirrors may be provided in the array. The array of individually controllable mirrors 15 may, for example, comprise a two-dimensional array. The array of mirrors 15 may, for example, comprise 100 or more mirrors, and may, for example, comprise 1000 or more mirrors. The array of mirrors 15 may be rectangular.

The microlens array 13 may be configured such that a different microlens is associated with each mirror of the array of individually controllable mirrors 15. The microlens array 13 may, for example, comprise a two-dimensional array. The microlens array 13 may, for example, comprise 100 or more microlenses, and may, for example, comprise 1000 or more microlenses. The microlens array may be rectangular.

Figure 3:
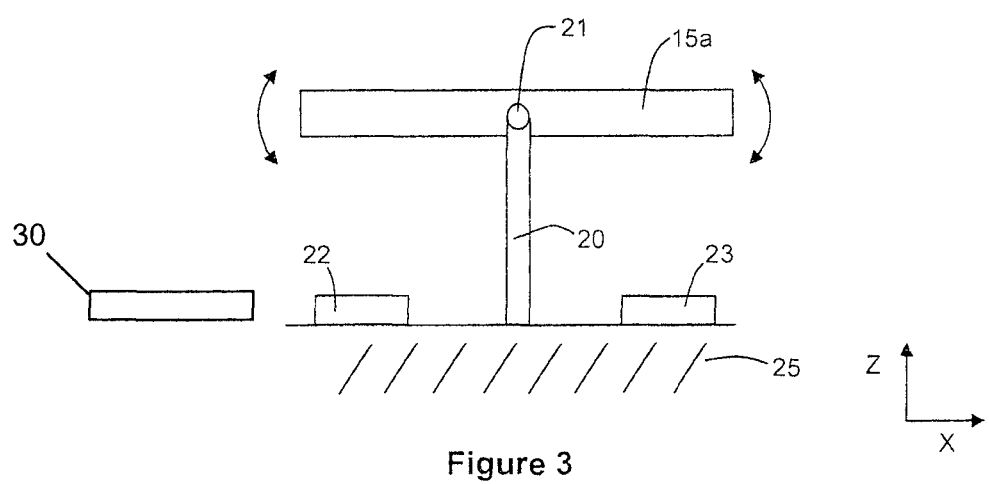
FIG. 3 shows a reflective element of the illumination system of FIG. 2 in more detail.

FIG. 3 is a schematic illustration of the first mirror 15a of the array of individually controllable mirrors viewed from one side (the other mirrors 15b-e may have the same construction). The mirror 15a is held on a pair of legs 20, only one of the legs being visible in FIG. 3. The mirror 15a is connected to the legs 20 via pivot 21 which allows the mirror to rotate as shown by the double-headed arrows. First and second electrodes 22, 23 (referred to hereafter as mirror electrodes) are provided beneath the mirror 15a. Both the mirror electrodes 22, 23 and the legs 20 are secured to a substrate 25.

In use, voltages are applied to the mirror electrodes 22, 23 by the controller CT1 (see FIG. 2). The voltages at the mirror electrodes 22, 23 are used to control the orientation of the mirror 15a via electrostatic attraction of the mirror. For example, providing a greater voltage on the first mirror electrode 22 than on the second mirror electrode 23 will pull the left hand end of the mirror 15a towards the first mirror electrode. Similarly, if a greater voltage is provided on the second mirror electrode 23 than is provided on the first mirror electrode 22, then the right hand end of the mirror 15a will be pulled towards the second mirror electrode. The controller CT1 may thus control the orientation of the mirror 15a by controlling the voltage at the mirror electrodes 22, 23. The orientation of the mirror 15a is controlled with sufficient accuracy to allow the mirror to direct a radiation sub-beam towards different desired locations in the intermediate plane 17, and to thereby contribute to different desired illumination modes.

A mirror orientation sensor is associated with each mirror 15a-e. The mirror orientation sensor may, for example, comprise a diode laser and an optical sensor (not shown) located on the substrate 25. The diode laser may be configured to direct radiation onto the rear surface of the mirror, and the optical sensor may be configured to detect the location at which reflected radiation is received at the substrate. The output from the optical sensor thus provides an indication of the orientation of the mirror. Any suitable radiation source may be used instead of the diode laser. The mirror orientation sensor may comprise any suitable orientation measuring apparatus.

Output from the orientation sensor is received by the controller CT1, thereby providing the controller CT1 with an indication of the orientation of the mirror. The controller may adjust the voltage provided to one or more of the mirror electrodes in response to the output from the orientation sensor. The orientation sensor and the controller CT1 thus form a servo loop, through which feedback is provided that allows the mirror to be moved to a desired orientation and held in a desired orientation.

Cartesian co-ordinates have been included in FIG. 3 in order to provide ease of explanation of FIG. 3. The Cartesian co-ordinates are not intended to imply that the mirror 15a, substrate 25 or any other component should be held in a particular orientation.

Referring to the Cartesian co-ordinates, the pivot 21 allows the mirror 15a to rotate about the y-axis. In order to provide flexibility when forming illumination modes using the mirror 15a, the mirror is also capable of rotating about the x-axis. Rotation of the mirror about the x-axis may be provided for by a gimbal, or any other suitable support which allows for the rotation of the mirror about the x-axis. Such supports are known in the art, and are thus not discussed here. In this context, it will be understood that the mirror 15a shown in FIG. 3 is shown in a simplified schematic form, and that mirrors used in embodiments of the invention may be very different from the mirror shown in FIG. 3. Electrodes (not shown) may be used to control the rotation of the mirror about the x-axis.

During operation of the lithographic apparatus, the orientations of the mirrors 15a-e of the array of individually controllable mirrors 15 may be selected to provide a spatial intensity distribution of the radiation beam B in the intermediate plane 17 which corresponds to a desired illumination mode. However, if the radiation beam B used by the lithographic apparatus is provided in bursts, then this may lead to instability in the orientation of one or more of the mirrors 15a-e. For example, one or more of the mirrors may have their orientations modified by a burst of the radiation beam B. This movement of a mirror 15a-e may change the spatial intensity distribution of the radiation beam B in the intermediate plane 17, and thus may change the illumination mode generated by the illumination system. This change of the illumination mode may have a detrimental effect upon a property of the lithographic apparatus such as the critical dimension, for example causing the critical dimension to change in an unwanted manner.

The change of orientation of a mirror 15a-e caused by a burst of radiation may move the mirror towards its neutral orientation (e.g. flat relative to the substrate 25 as shown in FIG. 3). This may be because the gain provided by the voltage on one or more of the mirror electrodes 22, 23 is reduced by the radiation.

Since orientation changes of the mirrors 15a-e may not be random (being instead, for example, towards a neutral orientation), radiation bursts may cause variation in the intensity of the radiation beam that is delivered by the illumination system IL to the projection system PS (see FIG. 1). If the illumination mode has a significant intensity near the numerical aperture of a pupil of the illumination system IL, then movement of one or more of the mirrors 15a-e caused by a radiation burst may cause radiation to enter the pupil which would not otherwise have entered the pupil. This will increase the intensity of the radiation beam B which is delivered to the projection system PS by the illumination system IL (see FIG. 1). The increased intensity of the radiation beam B may contribute to unwanted change of the critical dimension of the lithographic apparatus.

The orientations of the mirrors 15a-e are controlled by the controller CT1 using feedback provided by one or more mirror orientation sensors (as explained further above). However, the speed of response of the controller CT1 may be significantly slower than a leading edge of a burst of radiation, and is thus slower than the speed at which the orientation of a mirror 15a-e is changed by the burst of radiation. The mirror 15a-e is thus moved by the leading edge of the burst of radiation, and returns to its original orientation some time during the burst of radiation. The burst of radiation may, for example, last for between 50 and 100 ms (or some other duration), during which time the mirror 15a-e is returned to its original orientation by the controller CT1.

The problem of unwanted movement of the mirrors 15a-e caused by bursts of the radiation beam B is addressed by embodiments of the invention.

In an embodiment, the controller CT1 receives a trigger signal when a burst of radiation is incident upon the mirror array 15, or before the burst of radiation is incident upon the mirror array. Referring to FIG. 3, when the controller CT1 receives the trigger signal, it applies a force to one or more of the mirrors 15a-e which is equal in magnitude and opposite in direction to the force which is applied to the one or more mirrors by the burst of radiation. The force is applied by modifying voltage applied to one or more of the mirror electrodes. When the burst of radiation is incident upon the one or more mirrors 15a-e, the force applied by the burst of radiation is cancelled out by the force applied by the controller CT1. Consequently, the one or more mirrors 15a-e remain in their desired orientations and are not deflected by the burst of radiation.

An embodiment of the invention allows a desired illumination mode to be generated with higher accuracy than would be the case if the embodiment of the invention was not used. The controller CT1 may be said to apply a force to one or more mirrors 15a-e which compensates for the effect of the burst of radiation.

In an ideal arrangement, the trigger signal is synchronized with the radiation burst, such that the force applied to the one or more mirrors 15a-e by the controller CT1 exactly cancels out the force applied to the one or more mirrors 15a-e by the radiation burst. If the synchronization is not perfect, then a beneficial effect may still be seen since the force applied to the one or more mirrors 15a-e by the radiation burst is partially compensated. Imperfect synchronization may be referred to as substantial synchronization.

A conventional lithographic apparatus includes source control electronics which generate trigger signals for an associated source SO (see FIG. 1), causing the source to provide the radiation beam used by the lithographic apparatus. The source SO may be, for example, a laser. The trigger signals are used to ensure that radiation bursts are only generated by the laser when they are required by the lithographic apparatus. These same trigger signals may be sent to the controller CT1, and may be used to trigger the controller CT1 to apply force to the one or more mirrors 15a-e as described above and compensate for the effect of the laser burst. The trigger signal may be delayed prior to being received by the controller CT1, for example using a delay apparatus such as a delay line. The delay apparatus may provide an adjustable delay. The delay may be selected to provide synchronization between the force applied to the one or more mirrors 15a-e by the controller and the force applied to the one or more mirrors 15a-e by the radiation burst.

In an embodiment, instead of applying force to the one or more mirrors 15a-e in response to a trigger signal received from source control electronics, the force is applied in response to a trigger signal received from a radiation sensitive detector 30. The radiation sensitive detector may be, for example, located adjacent to the mirror array 15, and may be connected to the controller CT1.

The force to be applied to the one or more mirrors 15a-e in the presence of a radiation burst may be determined based upon experimental calibration. The behavior of the one or more mirrors 15a-e in the presence of a radiation burst is highly reproducible. The experimental calibration may, for example, comprise measuring the force applied to the one or more mirrors 15a-e as a function of the intensity of a radiation burst incident upon the one or more mirrors 15a-e. The applied force may be measured indirectly by measuring the rotation of a mirror caused by the burst of radiation. The calibration may be performed for a range of intensity values. Interpolation between calibration values may be used by the controller CT1. The calibration may be performed for different illumination modes. The force to be applied to the one or more mirrors 15a-e may be monitored and modified during operation of the lithographic apparatus, for example using a Kalman filter.

Above embodiments of the invention may be considered to provide feed-forward correction of the force applied to the mirrors 15a-e.

In an embodiment of the invention, instead of providing a feed-forward correction of the force applied to the one or more mirrors 15a-e, the one or more mirrors 15a-e are moved to offset orientations before a radiation burst is incident upon them. The offset orientation is such that when the radiation burst is incident upon the one or more mirrors 15a-e, it moves the one or more mirrors 15a-e to a desired orientation. The one or more mirrors 15a-e thereby provide a desired illumination mode in the presence of the radiation burst.

This embodiment of the invention may be explained in terms of set-points, set-points being orientations at which the controller CT1 attempts to maintain the one or more mirrors 15a-e. A first set-point of a given mirror is the desired orientation of that mirror (referred to hereafter as the desired set-point). A second set-point of the mirror is the orientation which is displaced from the desired orientation by an amount which is equal and opposite to the movement of the mirror which will be caused by a burst of radiation (referred to hereafter as the offset set-point).

During operation of the lithographic apparatus, the mirror may be held at the offset set-point when no radiation is incident upon the mirror. When a burst of radiation is incident upon the mirror, this will move the mirror to the desired orientation. When the burst of radiation is incident upon the mirror, the controller CT1 changes from applying the offset set-point to applying the desired set-point. The controller CT1 thus retains the mirror at the desired orientation during the radiation burst, and does not attempt to move the mirror to the offset orientation during the radiation burst. When the radiation burst ends, the controller CT1 changes from applying the desired set-point to applying the offset set-point. The mirror thus moves to the offset orientation in readiness for the next radiation burst to be incident upon it.

Although this embodiment of the invention has been described in terms of set-points, it may also be understood in terms of force. For example, when no radiation is incident upon the mirror, force is applied to the mirror which moves the mirror to the offset set-point. This force is substantially equivalent to the force required to move the mirror to the desired position, plus a force which is equal to but opposite in sign to the force which will be applied to the mirror by the radiation burst. Substantially the same force is applied to the mirror when the radiation burst is incident upon the mirror, thereby holding the mirror in its desired orientation.

The position of the offset set-point may be determined based upon experimental calibration. As mentioned above, the behavior of one or more mirrors 15a-e in the presence of a radiation burst is highly reproducible. The experimental calibration may, for example, comprise measuring the orientation change applied to the one or more mirrors 15a-e as a function of the intensity of a radiation burst incident upon the one or more mirrors 15a-e. The calibration may be performed for a range of intensity values. Interpolation between calibration values may be used by the controller CT1. The calibration may be performed for different illumination modes.

The position of the offset set-point may be monitored and modified during operation of the lithographic apparatus. For example, the movement of a mirror caused by a radiation burst may be measured using the mirror orientation sensor. This movement is compared with the difference between the desired set-point and the offset set-point. If the comparison reveals a difference, then the offset set-point is changed accordingly. This comparison and adjustment may be performed for each radiation burst, or may be performed less frequently.

The controller CT1 may switch between applying the desired set-point and applying the offset set-point in response to a trigger signal. The trigger signal may be generated, for example, by source control electronics, by a radiation sensitive detector, or by any other suitable means. The accuracy of the timing of the trigger signal may be less than in a feed-forward embodiment of the invention. The trigger signal may be sufficiently accurate that, for example, it switches the controller CT1 from the offset set-point to the desired set-point with a speed which is faster than the response of the controller. In other words, when the radiation burst is incident upon one or more mirrors 15a-e, the set-point of the controller is switched from the offset set-point to the desired set-point before the controller attempts to move the one or more mirrors 15a-e back to the offset set-point. This change of the set-point may occur before the radiation burst is incident upon the one or more mirrors 15a-e or while the radiation burst is incident upon the one or more mirrors 15a-e.

In an embodiment, the orientation of the one or more mirrors 15a-e is only monitored by the controller CT1 when a burst of radiation is incident upon one or more mirrors 15a-e. When the burst of radiation is incident upon one or more mirrors 15a-e, the force applied to the one or more mirrors 15a-e by the radiation burst is taken into account by the controller CT1 when determining the voltage to be applied to the one or more mirror electrodes 22, 23 in order to hold the one or more mirrors 15a-e at the desired orientation. When the burst of radiation ends, the controller CT1 stops monitoring the orientation of the one or more mirrors 15a-e. Thus, when the rotation caused by the radiation burst ends, the controller does not attempt to modify the voltage at one or more of the mirror electrodes 22, 23 to keep the one or more mirrors 15a-e in the desired orientation in the absence of the radiation burst. Instead, the one or more mirrors 15a-e are allowed to move to orientations which correspond to the desired orientations minus the rotation caused by the radiation burst. When the next burst of radiation is incident upon one or more mirrors 15a-e this returns the one or more mirrors 15a-e to the desired orientations. The one or more mirrors 15a-e are held at the desired orientation by the controller CT1 during the burst of radiation.

The mechanism which causes the radiation burst to move the mirrors is not yet understood. However, it may be that charge builds up on a mirror of the mirror array 15 in between bursts of the radiation beam, and that the charge is released when the radiation beam is incident upon the mirror. This release of charge may cause the mirror to change its orientation (since the mirror is operated via electrostatic attraction).

In an embodiment of the invention, the environment of the mirror array 15 is modified in order to eliminate or reduce the rotation of one or more mirrors 15a-e caused by radiation bursts. In an embodiment, one or more mirrors 15a-e are surrounded by an ionized gas (e.g. ionized air). The ionized gas prevents or reduces the build up of charge on one or more mirrors 15a-e. This may reduce or eliminate movement of one or more mirrors 15a-e which arises from a burst of radiation. This embodiment of the invention may be used in combination with other embodiments of the invention.

Surrounding one or more mirrors 15a-e of the mirror array 15 with an ionized gas may reduce drift in the response of the mirror orientation. The drift may arise from a build up of charge on a mirror of the mirror array 15, the charge causing the mirror orientation to change over time even though a voltage applied at one or more of the mirror electrodes remains constant. Reduced drift is advantageous, since it increases the accuracy with which illumination modes may be formed using the mirror array 15. In addition, it may be possible to move one or mirrors 15a-e to a desired orientation more quickly. This is because a feed-forward correction of the orientation due to drift of the mirror responses will be smaller, and may thus be performed faster.

Since the mirrors are electrostatically actuated, their electrostatic nature means that they may attract dust. Surrounding the mirrors of the mirror array 15 with ionized gas may avoid dust being attracted to the mirrors (or may reduce the attraction of dust to the mirrors).

Although embodiments of the invention have been described in the context of an array of mirrors, the invention may be applied to any suitable array of individually controllable optical (e.g., reflective, refractive or diffractive) elements.

In an embodiment, there is provided an illumination system comprising: an array of individually controllable optical elements, each element moveable between a plurality of orientations which may be selected in order to form desired illumination modes; and a controller to control orientation of one or more of the elements, the controller configured to apply force to the one or more of the elements which at least partially compensates for force applied to the one or more elements by a burst of radiation incident upon the one or more elements.

In an embodiment, the controller is configured to apply the force in substantial synchronization with a force applied to the one or more elements by the burst of radiation. In an embodiment, the controller is configured to apply the force to the one or more elements in response to a trigger signal. In an embodiment, the system further comprises an optical detector configured to generate the trigger signal when the optical detector receives a burst of radiation. In an embodiment, the controller is configured to apply the force to the one or more elements before the burst of radiation is incident upon the one or more elements, so as to move the one or more elements to an offset orientation from which the one or more elements is moved to a desired orientation by the force applied by the burst of radiation. In an embodiment, the controller is configured to apply substantially the same force to the one or more elements when the burst of radiation is incident upon the one or more elements, so as to hold the one or more elements in the desired orientation during the burst of radiation. In an embodiment, the controller is configured to monitor orientation of the one or more elements when the burst of radiation is incident thereupon, and is configured to not monitor the orientation of the one or more elements when the burst of radiation is not incident thereupon. In an embodiment, the elements are reflective elements. In an embodiment, there is provided a lithographic apparatus comprising the illumination system and further comprising: a support structure configured to support a patterning device, the patterning device configured to pattern the radiation beam delivered from the illumination system according to a desired pattern; a substrate table configured to hold a substrate; and a projection system configured to project the patterned beam onto a target portion of the substrate. In an embodiment, the lithographic apparatus includes source control electronics configured to generate a signal which triggers generation of a radiation burst by a radiation source, and wherein the controller uses this signal as the trigger signal.

In an embodiment, there is provided an illumination system comprising: an array of individually controllable optical elements, each element moveable between a plurality of orientations which may be selected in order to form desired illumination modes; and a controller to control the orientations of one or more of the elements, the controller configured to move the one or more elements to an offset orientation before a burst of radiation is incident upon the one or more elements, the offset orientation selected such that force applied by the burst of radiation moves the one or more elements to a desired orientation.

In an embodiment, the controller is configured to hold the one or more elements in the desired orientation during the burst of radiation, and then return the one or more elements to the offset orientation after the burst of radiation has ended.

In an embodiment, there is provided a method of selecting a desired illumination mode in an illumination system, the method comprising moving elements of an array of individually controllable optical elements to orientations which correspond with a desired illumination mode, and applying a force to one or more of the elements which at least partially compensates for a force which is applied to the one or more elements by a burst of radiation.

In an embodiment, the compensation force is applied to the one or more elements in substantial synchronization with the force applied to the one or more elements by the burst of radiation. In an embodiment, the compensation force is applied to the one or more elements in response to a trigger signal. In an embodiment, the trigger signal is generated by an optical detector when the optical detector receives the burst of radiation. In an embodiment, the compensation force is applied to the one or more elements before the burst of radiation is incident upon the one or more elements, so as to move the one or more elements to an offset orientation from which the one or more elements are moved to a desired orientation by the force applied by the burst of radiation. In an embodiment, substantially the same compensation force is applied to the one or more elements when the burst of radiation is incident upon the one or more elements, so as to hold the one or more elements in the desired orientation during the burst of radiation. In an embodiment, the method is performed by a lithographic apparatus, and wherein the trigger signal is generated by source control electronics of the lithographic apparatus and the source control electronics is also used to trigger a source of the burst of radiation.

In an embodiment, there is provided an illumination system comprising an array of individually controllable optical elements, each element moveable between a plurality of orientations which may be selected in order to form a desired illumination mode, wherein one or more of the elements are surrounded by an ionized gas.

In an embodiment, there is provided a method of selecting a desired illumination mode in an illumination system, the method comprising moving elements of an array of individually controllable optical elements to orientations which correspond with the desired illumination mode, the elements surrounded by ionized gas.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 167 or 126 nm), and EUV radiation (e.g. having a wavelength of 13.5 nm or lower).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An illumination system comprising:
an array of individually controllable optical elements, each element moveable between a plurality of orientations which may be selected in order to form desired illumination modes; and
a controller to control orientation of one or more of the elements, the controller configured to determine, prior to incidence of a burst of radiation upon the one or more elements, a force to be applied to the one or more of the elements, which force at least partially compensates for force applied to the one or more elements by the burst of radiation incident upon the one or more elements, and cause application of the compensation force to the one or more elements.

2. The illumination system of claim 1, wherein the controller is configured to apply the compensation force in substantial synchronization with a force applied to the one or more elements by the burst of radiation.

3. The illumination system of claim 1, wherein the controller is configured to apply the compensation force to the one or more elements in response to a trigger signal.

4. The illumination system of claim 3, further comprising an optical detector configured to generate the trigger signal when the optical detector receives a burst of radiation.

5. The illumination system of claim 1, wherein the controller is configured to apply the compensation force to the one or more elements before the burst of radiation is incident upon the one or more elements, so as to move the one or more elements to an offset orientation from which the one or more elements is moved to a desired orientation by the force applied by the burst of radiation.

6. The illumination system of claim 5, wherein the controller is configured to apply substantially the same compensation force to the one or more elements when the burst of radiation is incident upon the one or more elements, so as to hold the one or more elements in the desired orientation during the burst of radiation.

7. The illumination system of claim 1, wherein the controller is configured to monitor orientation of the one or more elements when the burst of radiation is incident thereupon, and is configured to not monitor the orientation of the one or more elements when the burst of radiation is not incident thereupon.

8. The illumination system of claim 1, further comprising a lithographic apparatus comprising:
a support structure configured to support a patterning device, the patterning device configured to pattern the radiation beam delivered from the illumination system according to a desired pattern;
a substrate table configured to hold a substrate; and
a projection system configured to project the patterned beam onto a target portion of the substrate.

9. The illumination system of claim 8, wherein the controller is configured to apply the compensation force to the one or more elements in response to a trigger signal and the lithographic apparatus includes source control electronics configured to generate a signal which triggers generation of a radiation burst by a radiation source, wherein the controller uses this signal as the trigger signal.

10. An illumination system comprising:
an array of individually controllable optical elements, each element moveable between a plurality of orientations which may be selected in order to form desired illumination modes; and
a controller to control the orientations of one or more of the elements, the controller configured to move the one or more elements to an offset orientation before a burst of radiation is incident upon the one or more elements, the offset orientation selected such that force applied by the burst of radiation moves the one or more elements to a desired orientation.

11. The illumination system of claim 10, wherein the controller is configured to hold the one or more elements in the desired orientation during the burst of radiation, and then return the one or more elements to the offset orientation after the burst of radiation has ended.

12. A method of selecting a desired illumination mode in an illumination system, the method comprising:
moving elements of an array of individually controllable optical elements to orientations which correspond with a desired illumination mode,
determining, prior to incidence of a burst of radiation upon one or more of the elements, a force to be applied to the one or more of the elements, which force at least partially compensates for a force which is applied to the one or more elements by the burst of radiation incident upon the one or more elements, and applying the compensation force to the one or more elements.

13. The method of claim 12, wherein the compensation force is applied to the one or more elements in substantial synchronization with the force applied to the one or more elements by the burst of radiation.

14. The method of claim 12, wherein the compensation force is applied to the one or more elements in response to a trigger signal.

15. The method of claim 14, wherein the trigger signal is generated by an optical detector when the optical detector receives the burst of radiation.

16. The method of claim 14, wherein the method is performed by a lithographic apparatus, and wherein the trigger signal is generated by source control electronics of the lithographic apparatus and the source control electronics is also used to trigger a source of the burst of radiation.

17. The method of claim 12, Wherein the compensation force is applied to the one or more elements before the burst of radiation is incident upon the one or more elements, so as to move the one or more elements to an offset orientation from which the one or more elements are moved to a desired orientation by the force applied by the burst of radiation.

18. The method of claim 17, wherein substantially the same compensation force is applied to the one or more elements when the burst of radiation is incident upon the one or more elements, so as to hold the one or more elements in the desired orientation during the burst of radiation.

19. An illumination system comprising:
an array of individually controllable optical elements, each element moveable between a plurality of orientations which may be selected in order to form desired illumination modes; and
a controller to control orientation of one or more of the elements, the controller configured to apply force to the one or more of the elements which at least partially compensates for force applied to the one or more elements by a burst of radiation incident upon the one or more elements, the controller configured to apply the force to the one or more elements separate from, or in addition to, a force applied to the one or more elements that is determined based upon a measurement of a position or orientation of the one or more elements by a sensor.

20. A method of selecting a desired illumination mode in an illumination system, the method comprising:
moving elements of an array of individually controllable optical elements to orientations which correspond with a desired illumination mode, and
applying a force to one or more of the elements which at least partially compensates for a force which is applied to the one or more elements by a burst of radiation, the applied force to the one or more elements being separate from, or in addition to, a force applied to the one or more elements that is determined based upon a measurement of a position or orientation of the one or more elements by a sensor.

* * * * *

UNITED STATES PATENT AND TRADEMARK OFFICE
CERTIFICATE OF CORRECTION

| | | |
|---|---|---|
| PATENT NO. | : 8,885,144 B2 | Page 1 of 1 |
| APPLICATION NO. | : 13/114652 | |
| DATED | : November 11, 2014 | |
| INVENTOR(S) | : Bert Jan Claessens et al. | |

It is certified that error appears in the above-identified patent and that said Letters Patent is hereby corrected as shown below:

On title page, item (75) Inventors, Line 8
 replace "Belgium (BE)"
 with --Geel (BE)--.

On page 2, item (56) References Cited - FOREIGN PATENT DOCUMENTS, Line 3
 replace "7009-152607"
 with --2009-152607--.

Signed and Sealed this
Tenth Day of March, 2015

Michelle K. Lee
*Deputy Director of the United States Patent and Trademark Office*